(12) United States Patent
Mok et al.

(10) Patent No.: US 9,054,339 B2
(45) Date of Patent: Jun. 9, 2015

(54) ORGANIC LIGHT EMITTING TRANSISTOR AND ORGANIC LIGHT EMITTING DISPLAY

(71) Applicant: Samsung Display Co., Ltd., Yongin (KR)

(72) Inventors: Rang-Kyun Mok, Yongin (KR); Dae-Sung Choi, Yongin (KR); Ki-Seo Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/041,025

(22) Filed: Sep. 30, 2013

(65) Prior Publication Data

US 2014/0124759 A1    May 8, 2014

(30) Foreign Application Priority Data

Nov. 5, 2012    (KR) .......................... 10-2012-0124420

(51) Int. Cl.
*H01L 51/52*    (2006.01)
*H01L 51/05*    (2006.01)

(52) U.S. Cl.
CPC .......... *H01L 51/5296* (2013.01); *H01L 51/057* (2013.01)

(58) Field of Classification Search
CPC ..................... H01L 51/5209; H01L 51/56225; H01L 51/5296; H01L 51/057
USPC .............................. 257/40, 773; 438/99, 666
See application file for complete search history.

(56) References Cited

U.S. PATENT DOCUMENTS

| | | | |
|---|---|---|---|
| 7,382,040 B2* | 6/2008 | Harada et al. | 257/642 |
| 7,868,319 B2* | 1/2011 | Adachi et al. | 257/40 |
| 8,158,970 B2* | 4/2012 | Obata et al. | 257/40 |
| 8,368,063 B2* | 2/2013 | Ukeda | 257/40 |
| 2005/0139824 A1* | 6/2005 | Park | 257/40 |
| 2009/0179195 A1* | 7/2009 | Obata et al. | 257/40 |
| 2009/0179208 A1* | 7/2009 | Obata et al. | 257/88 |
| 2009/0224233 A1* | 9/2009 | Obata et al. | 257/40 |
| 2010/0244710 A1* | 9/2010 | Obata et al. | 315/167 |
| 2014/0054613 A1* | 2/2014 | Facchetti | 257/79 |

FOREIGN PATENT DOCUMENTS

| | | |
|---|---|---|
| JP | 2007-200746 | 8/2007 |
| KR | 10-2006-0003633 | 1/2006 |

* cited by examiner

*Primary Examiner* — Allan R Wilson
(74) *Attorney, Agent, or Firm* — Knobbe Martens Olson & Bear LLP (57) ABSTRACT

An organic light emitting transistor includes: a first electrode positioned on a substrate; a gate electrode positioned on the first electrode and including an opening formed at a center region; a first auxiliary layer positioned within the opening; an organic emission layer positioned on the first auxiliary layer and the gate electrode; a second auxiliary layer positioned on the organic emission layer; and a second electrode positioned on the second auxiliary layer.

10 Claims, 7 Drawing Sheets

ORGANIC LIGHT EMITTING TRANSISTOR AND ORGANIC LIGHT EMITTING DISPLAY

CROSS-REFERENCE TO RELATED APPLICATIONS

This application claims priority to, and the benefit of, Korean Patent Application No. 10-2012-0124420 filed in the Korean Intellectual Property Office on Nov. 5, 2012, the entire contents of which are incorporated herein by reference.

BACKGROUND

1. Field

The described technology relates generally to an organic light emitting transistor and an organic light emitting display, and more particularly, to an organic light emitting transistor which includes an organic emission layer and a gate electrode positioned between a first electrode and a second electrode and an organic light emitting display.

2. Description of the Related Technology

A display device is a device that displays an image. Recently, an organic light emitting diode display has been drawing attention.

Unlike a liquid crystal display, an organic light emitting diode display has a self-luminous characteristic, and because the organic light emitting diode display does not need a separate light source, it can have a relatively small thickness and weight. In addition, the organic light emitting diode display exhibits high-quality characteristics, such as low power consumption, high luminance, high response speed, etc.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

The described technology has been made in an effort to provide an organic light emitting transistor configured to improve the uniformity of light emitted from an organic emission layer and an organic light emitting display.

A first embodiment provides an organic light emitting transistor including: a first electrode positioned on a substrate; a gate electrode positioned on the first electrode and including an opening formed at a center region; a first auxiliary layer positioned within the opening; an organic emission layer positioned on the first auxiliary layer and the gate electrode; a second auxiliary layer positioned on the organic emission layer; and a second electrode positioned on the second auxiliary layer.

The opening may be in the shape of a circle and be surrounded by the gate electrode in a planar view.

The opening may be in the shape of a regular polygon and be surrounded by the gate electrode in a planar view.

The opening may be in the shape of a regular octagon.

The opening may be in the shape of a regular hexagon.

The opening may be in the shape of a closed loop and be surrounded by the gate electrode in a planar view, and the gate electrode may further include at least one protrusion protruding toward the center point of the opening.

The first electrode may be an anode, the second electrode may be a cathode, the first auxiliary layer may be a channel through which holes move, and the second auxiliary layer may be a channel through which electrons move.

The organic light emitting transistor may further include an insulation layer positioned between the first electrode and the gate electrode.

The first auxiliary layer may be positioned between the first electrode and the organic emission layer, the bottom thereof may be in contact with the first electrode, the top thereof may be in contact with the organic emission layer, and the sides thereof may be in contact with the gate electrode.

A second embodiment provides an organic light emitting display including the organic light emitting transistor.

The organic light emitting display may further include: a driving power supply line connected to the first electrode; a common power supply line connected to the second electrode; a switching element connected to the gate electrode; a scan line connected to the switching element; a storage capacitor connected to the switching element and the gate electrode; and a data line connected to the storage capacitor.

According to one of several embodiments of the above-described solution of the present invention, there are provided an organic light emitting transistor configured to improve the uniformity of light emitted from an organic emission layer and an organic light emitting display.

DETAILED DESCRIPTION OF CERTAIN INVENTIVE EMBODIMENTS

The present invention will be described more fully hereinafter with reference to the accompanying drawings, in which certain embodiments of the invention are shown. The invention may, however, be embodied in many different forms and should not be construed as being limited to the embodiments set forth herein.

In order to clarify the description of the disclosed embodiments, elements extrinsic to their description are omitted. Further, like reference numerals generally refer to like elements throughout the application.

A first embodiment will be representatively described using the same reference numerals for elements having the same configuration in a variety of embodiments, and in the other embodiments, only the elements different than those of the first embodiment will be described.

In addition, the sizes and thicknesses of the elements in the drawings are not necessarily to scale, but rather presented for better understanding and ease of description. The present invention is not limited thereto.

In the drawings, the thickness of layers, films, panels, regions, etc., may be exaggerated for clarity. In the drawings, the thicknesses of layers and regions may be exaggerated for convenience of explanation. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. In addition, "on" is either positioned on or below a portion of a target or positioned on the upper side based on a gravity direction, throughout the specification.

Hereinafter, an organic light emitting display according to a first embodiment will be described with reference to FIGS. 1 to 4.

Figure 1:
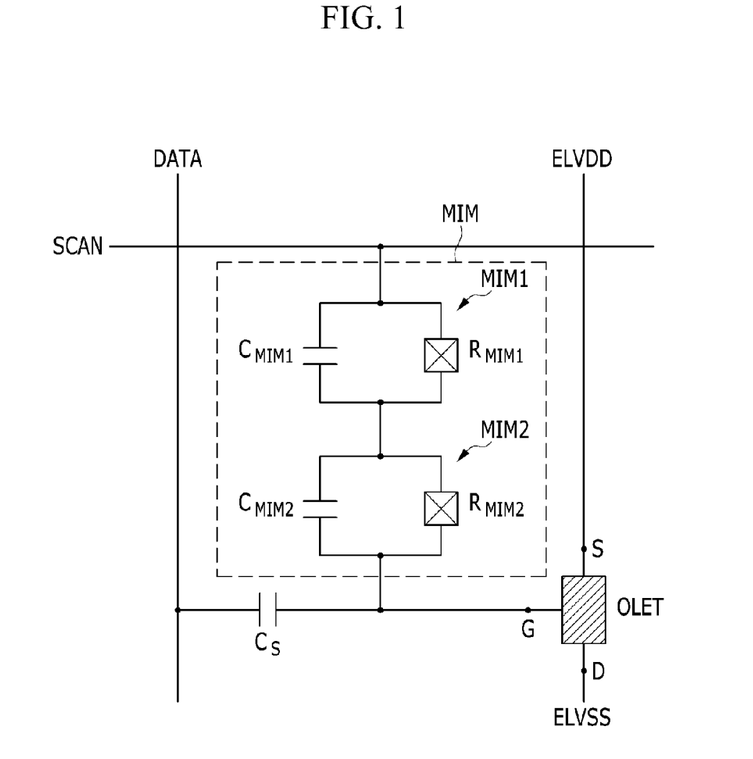
FIG. 1 is a circuit diagram showing an organic light emitting display according to a first embodiment.

FIG. 1 is a circuit diagram showing an organic light emitting display according to a first embodiment.

As shown in FIG. 1, the organic light emitting display according to the first embodiment displays an image using light emitted from an organic light emitting transistor OLET, and includes a driving power supply line ELVDD, a common power supply line ELVSS, a switching element MIM, a scan line SCAN, a storage capacitor Cs, a data line DATA, and an organic light emitting transistor OLET.

The driving power supply line ELVDD is connected to a first electrode serving as a source electrode S of the organic light emitting transistor OLET, and supplies driving power to the first electrode serving as the source electrode S of the organic light emitting transistor OLET.

The common power supply line ELVSS is connected to a second electrode serving as a drain electrode D of the organic light emitting transistor OLET, and supplies common power to the second electrode serving as the drain electrode D of the organic light emitting transistor OLET. The common power supply line ELVSS may be formed on the same layer as the second electrode serving as the drain electrode D of the organic light emitting transistor OLET or on a different layer from it.

The switching element MIM is connected to a gate electrode G of the organic light emitting transistor OLET, and may be equivalently replaced with a parallel-connected circuit including a resistance component and a capacitance component both having electrically identical characteristics. As the switching element MIM, two MIM elements including a first MIM element MIM1 and a second MIM element MIM2 may be connected in series, and the number of MIM elements is not necessarily limited thereto. The first MIM element MIM1 includes a first capacitance component $C_{MIM1}$ and a first resistance component $R_{MIM1}$ connected in parallel to each other, and the second MIM element MIM2 includes a second capacitance component $C_{MIM2}$ and a second resistance component $R_{MIM2}$. The switching element MIM is connected to the scan line SCAN and the gate electrode G of the organic light emitting transistor OLET, and turns the gate electrode G on and off in response to a scan signal.

The scan line SCAN is connected to the switching element MIM, and supplies a scan signal to the switching element MIM.

The storage capacitor Cs is connected to the switching element MIM, the data line Data, and the organic light emitting transistor OLET, respectively, and stores a data signal input to the gate electrode G of the organic light emitting transistor OLET during one frame.

The data line DATA is connected to the storage capacitor Cs, and supplies a data signal to the storage capacitor Cs.

The organic light emitting transistor OLET is a three-electrode type luminous body having a source electrode S, a drain electrode D, and a gate electrode G. The source electrode S serving as the first electrode, which may be an anode, is connected to the driving power supply line ELVDD having a high voltage, and the drain electrode D serving as the second electrode, which may be a cathode, is connected to the driving power supply line ELVSS having a low voltage emitting. Light emission of the organic light emitting transistor OLET of this type is controlled by a signal supplied to the gate electrode G. The organic light emitting transistor OLET may be provided in plural form, and the organic light emitting display may display an image by using a plurality of organic light emitting transistors OLETs.

Figure 2:
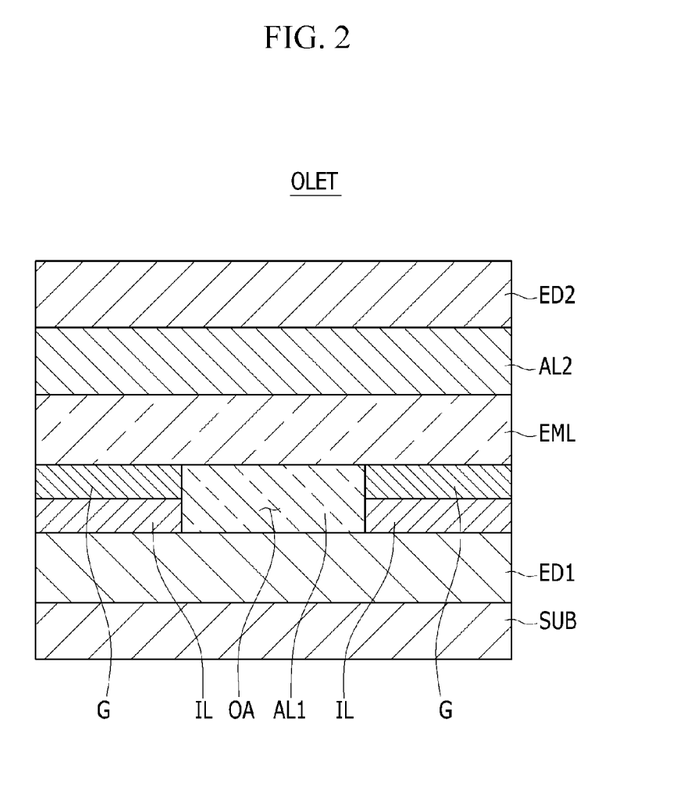
FIG. 2 is a cross-sectional view showing the organic light emitting transistor of FIG. 1.

FIG. 2 is a cross-sectional view showing the organic light emitting transistor of FIG. 1.

As shown in FIG. 2, the organic light emitting transistor OLET includes a first electrode ED1, an insulating layer IL, a gate electrode G, a first auxiliary layer AL1, an organic emission layer EML, a second auxiliary layer AL2, and a second electrode ED2.

The first electrode ED1 is positioned on an insulative substrate SUB including glass, polymer, or stainless steel. The first electrode ED1 is an anode, and may be formed as a light transmissive electrode, a semi-light-transmissive electrode, or a light reflective electrode.

The insulating layer IL is positioned between the first electrode ED1 and the gate electrode G, and functions to prevent short-circuiting between the first electrode ED1 and the gate electrode G. The insulating layer IL may include an inorganic material or organic material.

The gate electrode G is positioned on the first electrode ED1, and disposed between the first electrode ED1 and the organic emission layer EML.

Figure 3:
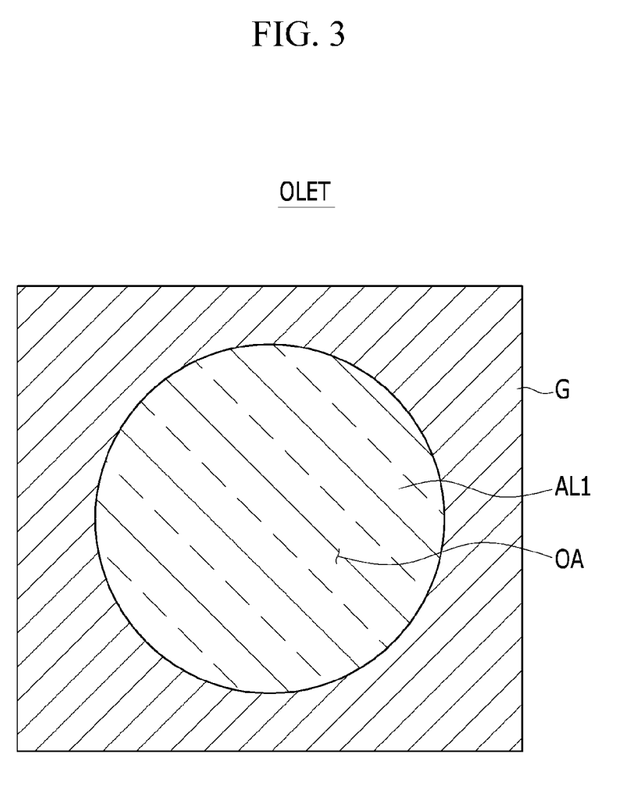
FIG. 3 is a top plan view showing the gate electrode of the organic light emitting transistor of FIG. 2.

FIG. 3 is a top plan view showing the gate electrode of the organic light emitting transistor of FIG. 2.

As shown in FIG. 3, the gate electrode G includes an opening OA formed at a center region. The gate electrode G is formed to surround the opening OA, and therefore the opening OA is surrounded by the gate electrode G in a planar view. The opening OA is in the shape of a circle surrounded by the gate electrode G in a planar view.

The gate electrode G may be formed as a light transmissive electrode, a semi-light-transmissive electrode, or a light reflective electrode.

Referring again to FIG. 2, the first auxiliary layer AL1 is positioned on the first electrode ED1, and disposed within the opening OA. The first auxiliary layer AL1 is a channel through which holes move, and may include at least one hole injection layer HIL and at least one hole transport layer HTL. The first auxiliary layer AL1 is disposed within the opening OA between the first electrode ED1 and the organic emission layer EML, its bottom is in contact with the first electrode ED1, its top is in contact with the organic emission layer EML, and its sides are in contact with the gate electrode G. The holes moving through the first auxiliary layer AL1 may be controlled according to the strength of an electric field generated by a gate voltage Vg supplied to the gate electrode G.

The organic emission layer EML is a layer in which holes and electrons respectively injected from the first electrode ED1 and the second electrode ED2 are combined with each other. The organic emission layer EML may include a red light emission layer for emitting red light, a green light emission layer for emitting green light, and a blue light emission layer for emitting blue light.

An additional insulating layer IL may be positioned between the gate electrode G and the organic emission layer EML to control emission characteristics of the organic emission layer EML.

The second auxiliary layer AL2 is positioned on the organic emission layer EML. The second auxiliary layer AL2 is a channel through which electrons move, and may include at least one electron injection layer EIL and at least one electron transport layer ETL.

The second electrode ED2 is a cathode, and may be formed as a light transmissive electrode, a semi-light-transmissive electrode, or a light reflective electrode.

Holes and electrons are injected into the organic emission layer EML from the first electrode ED1 and the second electrode ED2, respectively, and re injected into the organic emission layer EML, and when excitons formed by recombinations of the injected holes and electrons drop from an excited state to a ground state, the organic emission layer 720 emits light.

By varying the voltage supplied to the gate electrode G, the amount of holes supplied to the organic emission layer EML from the first electrode ED1 through the first auxiliary layer AL1 is controlled, and therefore the quantity of light emitted from the organic emission layer EML is controlled.

Specifically, the gate voltage Vg supplied to the gate electrode G affects the amount of electric charges moving from the first electrode ED1 to the second electrode ED2. For example, if the gate voltage Vg is applied to the gate electrode G such that the amount of electric charges moving between the first electrode ED1 and the gate electrode G increases, the amount of holes moving through the first auxiliary layer AL1 increases and hence the quantity of light emitted from the organic emission layer EML increases; whereas if the gate voltage Vg is applied to the gate electrode G such that the amount of electric charges moving between the first electrode ED1 and the gate electrode G decreases, the amount of holes moving through the first auxiliary layer AL1 decreases and hence the quantity of light emitted from the organic emission layer EML decreases. That is, when a given voltage is applied to the first electrode ED1 and the second electrode ED2 from the driving power supply line ELVDD and the common power supply line ELVSS, respectively, the quantity of light emitted from the organic emission layer EML can be controlled by varying the gate voltage Vg supplied to the gate electrode G.

Figure 4:
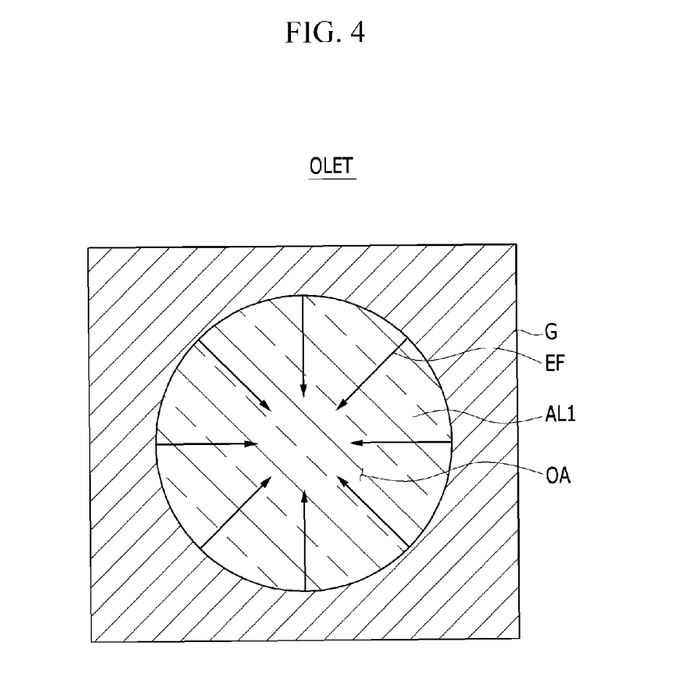
FIG. 4 is a view for explaining an emission characteristic obtained using the gate electrode of the organic light emitting transistor of FIG. 3.

FIG. 4 is a view for explaining an emission characteristic obtained using the gate electrode of the organic light emitting transistor of FIG. 3.

As shown in FIG. 4, in the above-described organic light emitting transistor OLET of the organic light emitting display, the opening OA of the gate electrode G is in the shape of a circle in a planar view. Thus, an electric field EF generated by the gate electrode G is applied uniformly to the first auxiliary layer AL1 positioned within the opening OA and therefore the electric field EF is uniformly applied to the inside from the outside of the opening OA acting as a light emitting surface. As a consequence, the uniformity of light emitted from the organic emission layer EML through the opening OA acting as a substantial light emission area is improved. This acts as a factor for lowering the gate voltage Vg supplied to the gate electrode G and also as a factor for improving the off characteristics of the organic light emitting transistor OLET. Accordingly, the overall luminous efficiency of the organic light emitting display including the organic light emitting transistor OLED is improved.

An organic light emitting transistor according to a second embodiment will be described below with reference to FIG. 5.

Hereinafter, only characteristic portions different from the first embodiment are described and portions in which a description is omitted follow a description of the first embodiment. In the second embodiment, for better comprehension and ease of description, constituent elements identical to or corresponding to those according to the first embodiment are denoted by the same reference numerals.

Figure 5:
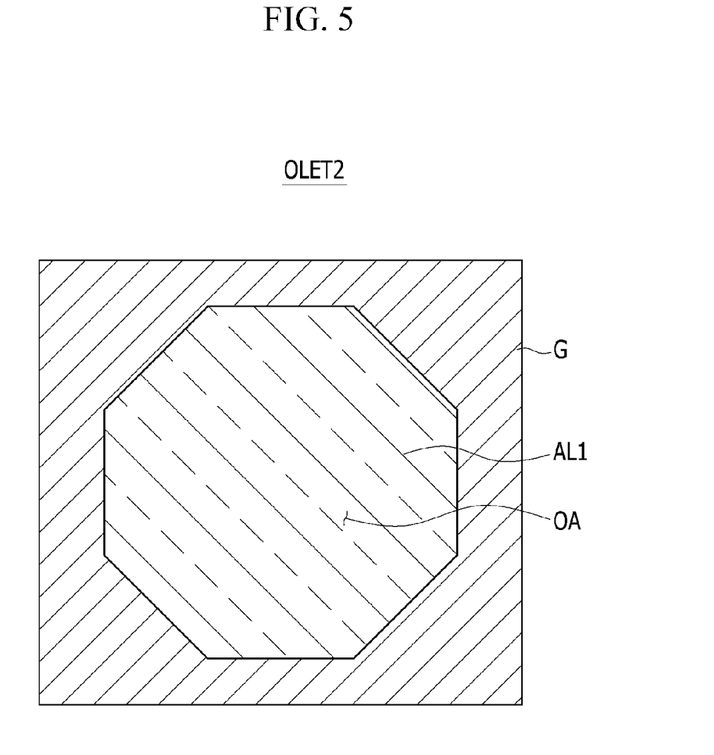
FIG. 5 is a top plan view showing a gate electrode of an organic light emitting transistor according to a second embodiment.

FIG. 5 is a top plan view showing a gate electrode of an organic light emitting transistor according to a second embodiment.

As shown in FIG. 5, a gate electrode G of an organic light emitting transistor OLET2 according to the second embodiment includes an opening OA formed at a center region. The gate electrode G is formed to surround the opening OA, and therefore the opening OA is surrounded by gate electrode G in a planar view. The opening OA is in the shape of a regular polygon surrounded by the gate electrode G in a planar view. Specifically, in some embodiments, the opening OA has a regular octagonal shape.

In the above-described organic light emitting transistor OLET2 according to the second embodiment, the opening OA of the gate electrode G is in the shape of a regular octagon in a planar view. Thus, an electric field EF generated by the gate electrode G is applied uniformly to the first auxiliary layer AL1 positioned within the opening OA and therefore the electric field EF is uniformly applied to the inside from the outside of the opening OA acting as a light emitting surface. As a consequence, the uniformity of light emitted from the organic emission layer EML through the opening OA acting as a substantial light emission area is improved. This acts as a factor for lowering the gate voltage Vg supplied to the gate electrode G and also as a factor for improving the off characteristics of the organic light emitting transistor OLET. Accordingly, the overall luminous efficiency of the organic light emitting display including the organic light emitting transistor OLET is improved.

An organic light emitting transistor according to a third embodiment will be described below with reference to FIG. 6.

Hereinafter, only characteristic portions different from the first embodiment are described and portions in which a description is omitted follow a description of the first embodiment. In the third embodiment, for better comprehension and ease of description, constituent elements identical to or corresponding to those according to the first embodiment are denoted by the same reference numerals.

Figure 6:
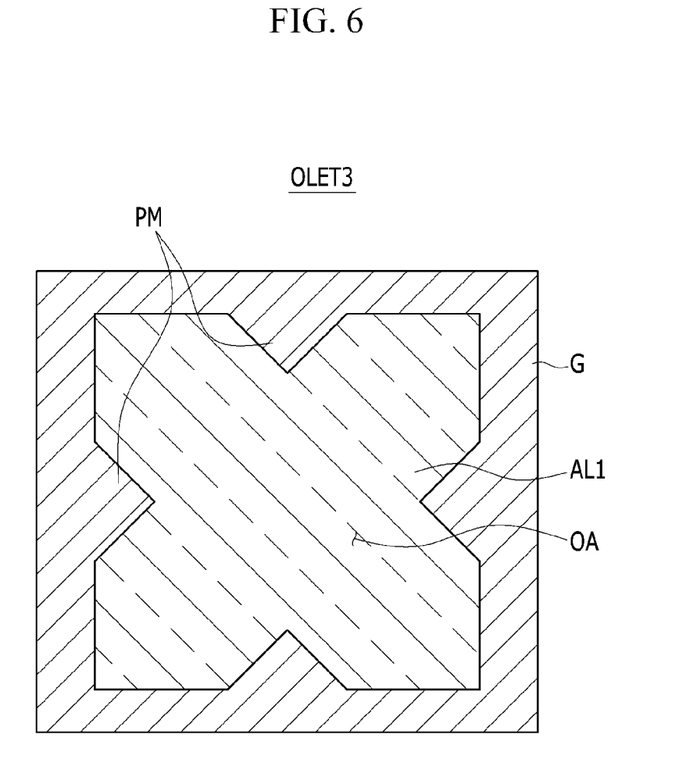
FIG. 6 is a top plan view showing a gate electrode of an organic light emitting transistor according to a third embodiment.

FIG. 6 is a top plan view showing a gate electrode of an organic light emitting transistor according to a third embodiment.

As shown in FIG. 6, a gate electrode G of an organic light emitting transistor OLET3 according to the third embodiment includes an opening OA formed at a center region. The gate electrode G is formed to surround the opening OA, and therefore the opening OA is surrounded by the gate electrode G in a planar view. The opening OA is in the shape of a closed loop surrounded by the gate electrode G in a planar view. The gate electrode G includes four protrusions PM protruding toward the center point of the opening OA. The protrusions PM are in the shape of a triangle, and the number of protrusions PM may be 1, 2, 3, 5, or more.

In the above-described organic light emitting transistor OLET3 according to the third embodiment, the opening OA of the gate electrode G is in the shape of a closed loop in a planar view, and at least one protrusion PM protrudes toward the center point of the opening OA. Thus, an electric field EF is applied to an edge portion of the opening, as well as to a center portion of the opening OA, over the same distance, thereby lowering the gate voltage Vg supplied to the gate electrode G.

An organic light emitting transistor according to a fourth embodiment will be described below with reference to FIG. 7.

Hereinafter, only characteristic portions different from the first embodiment are described and portions in which a description is omitted follow a description of the first embodiment. In the fourth embodiment, for better comprehension and ease of description, constituent elements identical to or corresponding to those according to the first embodiment are denoted by the same reference numerals.

Figure 7:
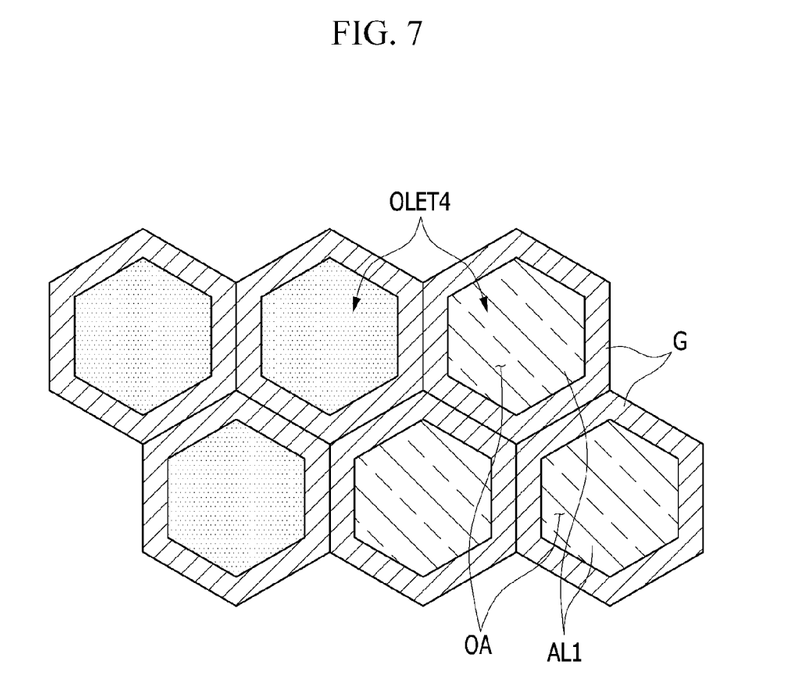
FIG. 7 is a top plan view showing a gate electrode of an organic light emitting transistor according to a fourth embodiment.

FIG. 7 is a top plan view showing a gate electrode of an organic light emitting transistor according to a fourth embodiment.

As shown in FIG. 7, an organic light emitting transistor OLET4 according to the fourth embodiment is provided in plural form, and the gate electrode G of each of the plurality of organic light emitting transistors OLET4 includes an opening OA formed at a center region. The gate electrode G is formed to surround the opening OA, and therefore the opening OA is surrounded by the gate electrode G in a planar view. The opening OA is in the shape of a regular polygon surrounded by the gate electrode G in a planar view. Specifically, in some embodiments, the opening OA has a regular hexagonal shape.

In the above-described organic light emitting transistor OLET4 according to the fourth embodiment, the opening OA of the gate electrode G is in the shape of a regular hexagon in a planar view. This can minimize the aperture ratio and reduce process dispersion. Conventionally, in the manufacture of a high-resolution display, in-process problems occur as pixel size becomes smaller and a switching element and a storage capacitor having emission characteristics become smaller. However, the organic light emitting transistor OLET4 according to the fourth embodiment is capable of controlling the emission characteristics depending on gate voltage application time and gate voltage difference, and improving the aperture ratio and reducing the pixel size because the opening OA is in the shape of a regular hexagon. Moreover, the present invention can be applied to reduce the overall burden of process dispersion and cope with high-resolution pixels by forming a plurality of organic emission layers corresponding to a plurality of openings OA in the formation of an organic emission layer using a deposition or application process.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting transistor comprising:
    a first electrode positioned on a substrate;
    a gate electrode positioned on the first electrode and including an opening formed at a center region;
    a first auxiliary layer positioned within the opening;
    an organic emission layer positioned on the first auxiliary layer and the gate electrode, wherein a top of the gate electrode is in contact with the organic emission layer;
    a second auxiliary layer positioned on the organic emission layer; and
    a second electrode positioned on the second auxiliary layer,
    wherein the first auxiliary layer is positioned between the first electrode and the organic emission layer, a bottom of the first auxiliary layer is in contact with the first electrode, a top of the first auxiliary layer is in contact with the organic emission layer, and sides of the first auxiliary layer are in contact with the gate electrode.

2. The organic light emitting transistor of claim 1, wherein the opening is in a circular shape and is surrounded by the gate electrode in a planar view.

3. The organic light emitting transistor of claim 1, wherein the opening is in a shape of a regular polygon and is surrounded by the gate electrode in a planar view.

4. The organic light emitting transistor of claim 3, wherein the opening is in the shape of a regular octagon.

5. The organic light emitting transistor of claim 3, wherein the opening is in the shape of a regular hexagon.

6. The organic light emitting transistor of claim 1, wherein
    the first electrode is an anode,
    the second electrode is a cathode,
    the first auxiliary layer is a channel through which holes move, and
    the second auxiliary layer is a channel through which electrons move.

7. The organic light emitting transistor of claim 1, further comprising an insulation layer positioned between the first electrode and the gate electrode.

8. An organic light emitting display comprising the organic light emitting transistor of claim 1.

9. The organic light emitting display of claim 8, further comprising:
    a driving power supply line connected to the first electrode;
    a common power supply line connected to the second electrode;
    a switching element connected to the gate electrode;
    a scan line connected to the switching element;
    a storage capacitor connected to the switching element and the gate electrode; and
    a data line connected to the storage capacitor.

10. An organic light emitting transistor comprising:
    a first electrode positioned on a substrate;
    a gate electrode positioned on the first electrode and including an opening formed at a center region;
    a first auxiliary layer positioned within the opening;
    an organic emission layer positioned on the first auxiliary layer and the gate electrode;
    a second auxiliary layer positioned on the organic emission layer; and
    a second electrode positioned on the second auxiliary layer,
    wherein the opening is in the shape of a closed loop and is surrounded by the gate electrode in a planar view, and
    the gate electrode further comprises at least one protrusion protruding toward a center point of the opening.

* * * * *